United States Patent
Fan et al.

(10) Patent No.: US 11,646,608 B2
(45) Date of Patent: May 9, 2023

(54) WIRELESS CHARGING METHOD, ELECTRONIC DEVICE, AND READABLE STORAGE MEDIUM

(71) Applicant: BEIJING XIAOMI MOBILE SOFTWARE CO., LTD., Beijing (CN)

(72) Inventors: Jie Fan, Beijing (CN); Changyu Sun, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 373 days.

(21) Appl. No.: 16/886,027

(22) Filed: May 28, 2020

(65) Prior Publication Data

US 2021/0159739 A1 May 27, 2021

(30) Foreign Application Priority Data

Nov. 22, 2019 (CN) .......................... 201911171920.9

(51) Int. Cl.
*H02J 50/90* (2016.01)
*H02J 50/80* (2016.01)
*H02J 50/12* (2016.01)
*G06F 3/16* (2006.01)
*H02J 7/02* (2016.01)
*H05K 7/20* (2006.01)
*H02J 50/00* (2016.01)

(52) U.S. Cl.
CPC .............. *H02J 50/90* (2016.02); *G06F 3/165* (2013.01); *H02J 7/02* (2013.01); *H02J 50/00* (2016.02); *H02J 50/12* (2016.02); *H02J 50/80* (2016.02); *H05K 7/20945* (2013.01)

(58) Field of Classification Search
CPC ....................... H02J 7/00034; H02J 7/000309
USPC ......................................................... 320/108
See application file for complete search history.

(56) References Cited

U.S. PATENT DOCUMENTS

2017/0237278 A1* 8/2017 Zhang .................... G01B 7/003
320/108

FOREIGN PATENT DOCUMENTS

EP         3197012 A1     7/2017
KR       20140095352 A    8/2014
KR       20140095352 A  * 8/2014 ............. G06F 3/017

OTHER PUBLICATIONS

OA1 for EP Application 20178456.8, mailed on Jul. 23, 2020.

* cited by examiner

*Primary Examiner* — Edward Tso
*Assistant Examiner* — Ahmed H Omar
(74) *Attorney, Agent, or Firm* — Syncoda LLC; Feng Ma

(57) ABSTRACT

A wireless charging method can be applied to a wireless charging device and include: acquiring a charging parameter of a target electronic device, in which the charging parameter includes a current temperature parameter of the target electronic device; and dynamically adjusting a magnetic levitation distance between the wireless charging device and the target electronic device according to the temperature parameter.

17 Claims, 6 Drawing Sheets

WIRELESS CHARGING METHOD, ELECTRONIC DEVICE, AND READABLE STORAGE MEDIUM

CROSS-REFERENCE TO RELATED APPLICATION

This application claims priority to Chinese Patent Application No. 201911171920.9 filed Nov. 22, 2019, the disclosure of which is hereby incorporated by reference in its entirety.

BACKGROUND

Currently, a wireless charging device may charge at a certain distance, for example, at a fixed value of 20 cm. However, in a process of a remote charging, a receiving end cannot receive all energy transmitted by a transmitting end, that is, an energy conversion efficiency is low in the wireless charging process, so that a heat productivity of the receiving end is increased, and a charging efficiency of the receiving end is further affected by the excessively-high temperature of the receiving end and an electronic device to be charged.

SUMMARY

The present disclosure relates generally to wireless charging technologies, and more specifically to a wireless charging method, an electronic device, and a readable storage medium.

According to a first aspect of embodiments of the present disclosure, there is provided the wireless charging method applied to a wireless charging device. The method includes: acquiring a charging parameter of a target electronic device, in which the charging parameter includes a current temperature parameter of the target electronic device; and dynamically adjusting a magnetic levitation distance between the wireless charging device and the target electronic device according to the temperature parameter.

According to a second aspect of embodiments of the present disclosure, there is provided an electronic device. The electronic device includes: a processor; a memory configured to store instructions executable by the processor. The processor is configured to execute the executable instructions in the memory to implement the method according to the first aspect.

According to a third aspect of embodiments of the present disclosure, there is provided a readable storage medium having stored therein computer programs that, when executed by a processor, causes to implement the method according to the first aspect.

It is to be understood that both the foregoing general description and the following detailed description are exemplary and explanatory only and are not restrictive of the present disclosure.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosures.

DETAILED DESCRIPTION

Figure 1:
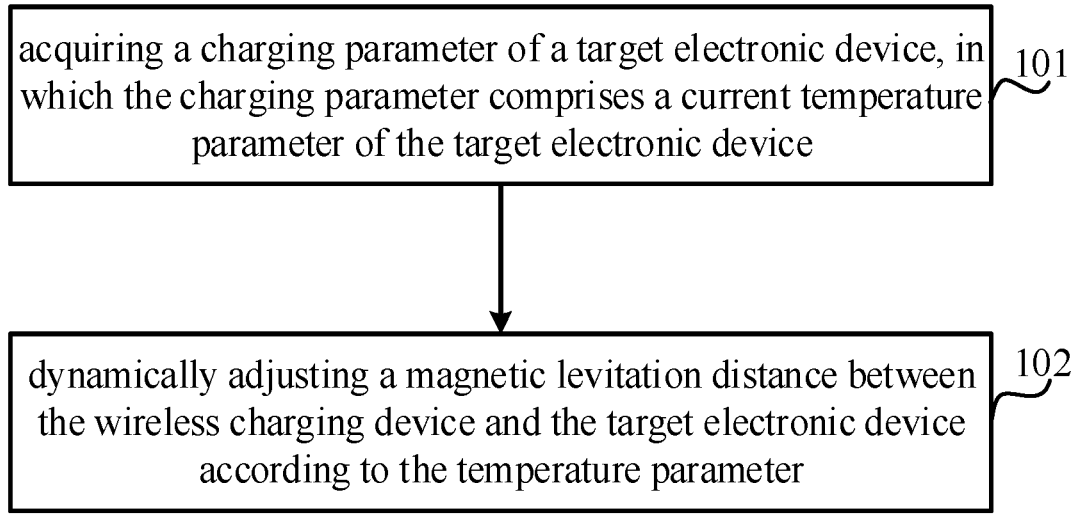
FIG. 1 is a flow diagram illustrating a wireless charging method according to some embodiments.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. Instead, they are merely examples of apparatuses and methods consistent with aspects related to the present disclosure as recited in the appended claims.

Currently, when a wireless charging device adopts a wireless charging protocol A4WP, a transmitting end and a receiving end may transfer an energy of the transmitting end to the receiving end through a resonance mode, and a resonant frequency of the transmitting end and the receiving end is 6.78 MHz. When the transmitting end transmits the energy to the receiving end through the resonant frequency of 6.78 MHz, after a receiving coil of the receiving end receives the energy, alternating current (AC) energy is rectified into direct current (DC) energy by a rectifying circuit, and the DC energy is converted into voltage and current required by a load through a DC-DC circuit and is output to the load. Meanwhile, the transmitting end and the receiving end communicate through a 2.4 GHz communication frequency, so that a real-time information interaction between the receiving end and the transmitting end is realized. If an emergency occurs during a charging process, such as an overcurrent, an overvoltage or an over-high temperature, the transmitting end or the receiving end may cut off a related circuit in time to protect the charging device.

However, in a process of a remote charging, the receiving end cannot receive all the energy transmitted by the transmitting end, that is, an energy conversion efficiency is low in the wireless charging process, so that a heat productivity of the receiving end is increased, and a charging efficiency of the receiving end is further affected by the over-high temperatures of the receiving end and the electronic device to be charged.

In order to solve the above technical problem, various embodiment of the present disclosure provides the wireless charging method, and an inventive concept thereof is that an electronic device may be suspended above the wireless charging device by the current in the transmitting coil in the wireless charging device, so that a magnetic levitation height of the electronic device (i.e., a magnetic levitation distance between the wireless charging device and the electronic device) may be adjusted according to a charging state of the electronic device, and a heat dissipation rate of the electronic device meets a requirement of the wireless charging, thereby achieving a purpose of improving the charging efficiency of the electronic device and achieving an effect of adjusting the heat dissipation rate of the electronic device.

It should be noted that, in embodiments of the present disclosure, the wireless charging device refers to a device capable of radiating energy into a space, and may be regarded as the transmitting end in a wireless charging system, and the electronic device is a device to be wirelessly charged and may be regarded as the receiving end in the wireless charging system. In order to ensure a normal operation, the wireless charging device may be provided with a holding circuit such as overvoltage, overcurrent, undervoltage and the like. It is understood that, only modules or devices related to the wireless charging method are referred to in the subsequent embodiments.

FIG. 1 is a flow diagram illustrating a wireless charging method according to an example embodiment. Referring to FIG. 1, the wireless charging method, which may be applied to a wireless charging device, includes operations at blocks 101 to 102:

At block 101, a charging parameter of a target electronic device is acquired. The charging parameter includes a current temperature parameter of the target electronic device.

In the embodiment, the wireless charging device and the target electronic device are both provided with Bluetooth modules, and the two Bluetooth modules may communicate with each other to realize a data transmission between the two devices. For convenience of description, one of the Bluetooth modules of the wireless charging device and the target electronic device is referred to as a Bluetooth module, and the other Bluetooth module is referred to as an opposite-end Bluetooth module, so as to distinguish the Bluetooth modules. Of course, in some examples, Wi-Fi modules, infrared modules, and the like may be disposed in both the wireless charging device and the target electronic device, and a communication function may also be implemented, and corresponding solutions fall within a protection scope of the present disclosure.

In the embodiment, one or more temperature detection modules may be disposed in the target electronic device, and the temperature detection module may detect a current temperature in the target electronic device, especially a temperature of a battery and temperatures of other critical circuits or devices (such as a processor) during charging. A number and positions of the temperature detection modules may be disposed according to a specific scenario, which is not limited here.

In an example, the target electronic device may take its current temperature as the charging parameter of the electronic device.

In another example, a relationship table of the temperature and the grade may be preset in the target electronic device, for example, if the current temperature parameter is greater than or equal to 55 degrees, the temperature grade is over-high, and a charging power may be reduced; if the current temperature parameter is greater than or equal to 30 degrees and less than 55 degrees, the temperature grade is normal, and the current charging power may be kept; and if the current temperature parameter is less than 30 degrees, the temperature grade is lower, and the charging power may be improved. It can be understood that, those skilled in the art may adjust the relationship table of the temperature and the grade according to the specific scenario, and the corresponding solution falls into the protection scope of the present disclosure.

That is, the charging parameter in the present embodiment is related to the current temperature of the electronic device to be charged, and may include at least one of the following: the current temperature of the electronic device, a current temperature grade determined based on the current temperature.

In the embodiment, the Bluetooth module in the wireless charging device may communicate with the opposite-end Bluetooth module in the target electronic device, so as to acquire the charging parameter of the target electronic device.

It should be noted that the wireless charging device may communicate with the target electronic device in real time, so as to acquire the charging parameter. Of course, the target electronic device may also communicate with the wireless charging device only if the temperature is over-high or too low, and the wireless charging device may acquire the charging parameter. Those skilled may set according to the specific scenario, and the corresponding solution falls into the protection scope of the present disclosure under a condition of acquiring the charging parameter is realized.

For convenience of description, in the embodiment, after the wireless charging device receives the charging parameter, the magnetic levitation distance of the target electronic device needs to be adjusted.

At block 102, the magnetic levitation distance between the wireless charging device and the target electronic device is dynamically adjusted according to the temperature parameter.

Figure 2:
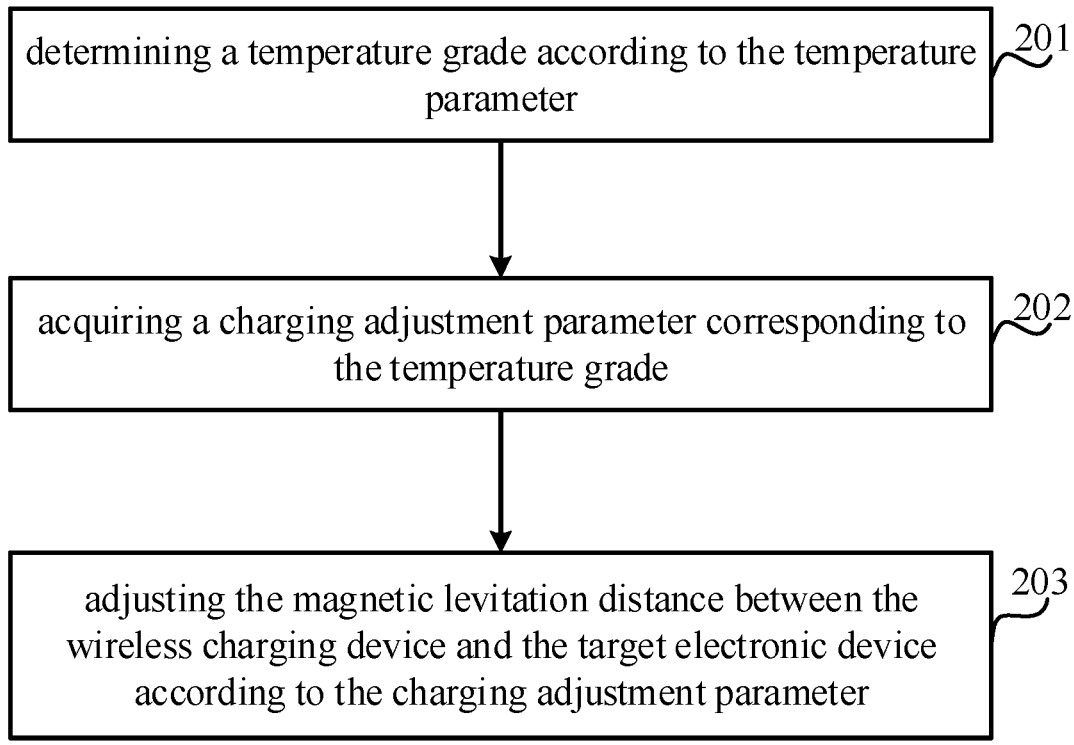
FIG. 2 is a flow diagram illustrating a wireless charging method according to some other embodiments.

In the embodiment, the wireless charging device may adjust the magnetic levitation distance between the wireless charging device and the target electronic device according to the temperature parameter. Referring to FIG. 2, the wireless charging device may determine a corresponding temperature grade according to the temperature parameter (corresponding to block 201). Then, the wireless charging device may acquire a charging adjustment parameter corresponding to the temperature grade (corresponding to block 202). Thereafter, the wireless charging device may adjust the magnetic levitation distance between the wireless charging device and the target electronic device according to the charging adjustment parameter (corresponding to block 203).

The following describes an adjustment of the magnetic levitation distance in detail by taking an increase of height of the target electronic device (i.e. the increase of the magnetic levitation distance) and a decrease of height of the target electronic device (i.e. the decrease of the magnetic levitation distance) as examples.

In a first situation, the magnetic levitation distance is increased.

In an example, the wireless charging device may determine what the charging parameter indicates, for example, the charging parameter indicates that the current temperature of the electronic device is within a first set range, for example, the first set range may be set to be less than 30 degrees, so that the wireless charging device may increase the current of the transmitting coil in the wireless charging device to a first target current corresponding to the first set range, so as to raise the magnetic levitation distance between the wireless charging device and the target electronic device from the current magnetic levitation distance to a first target distance corresponding to the first target current.

In this example, the first target current may be calculated by the target electronic device. The magnetic levitation distance of the target electronic device before the adjustment (i.e., a height of the target electronic device from the wireless charging device) is known, and the first target distance corresponding to the charging parameter (i.e., the magnetic levitation distance after the adjustment) is also known. Therefore, based on a relationship between the magnetic levitation distance and a gravity (e.g. G=mgh, G represents the gravity, m represents a mass of the target electronic device, and h represents the magnetic levitation distance), the target electronic device may calculate the gravity of the target electronic device according to the first target distance. In the levitation process, the gravity of the target electronic device and a magnetic field force generated by the wireless charging device are equal in magnitude and opposite in direction. Based on a relation between the magnetic field force and the gravity, the target electronic device may calculate the first target current according to the relation between the magnetic field force and the current. Finally, the wireless charging device may communicate with the target electronic device to acquire the first target current.

The wireless charging device may then adjust the current in the transmitting coil to the first target current, thereby increasing the magnetic levitation distance between the wireless charging device and the target electronic device to the first target distance. The current in the transmitting coil may be adjusted slowly by the wireless charging device in a set step length (adjustable) manner, so that a levitation height of the target electronic device slowly rises, and the magnetic levitation distance between the wireless charging device and the target electronic device is increased.

It should be noted that, the wireless charging device may also calculate the first target current. In consideration of a fact that the target electronic device may calculate the first target current by using a processor of the electronic device, the calculation at the wireless charging device is not needed. Therefore, a design difficulty of the wireless charging device is favorably reduced. Those skilled in the art may set according to the specific scenario, and the corresponding solution falls into the protection scope of the present disclosure under the condition that the target current may be calculated.

In another example, the target electronic device may be provided with a distance detection module that may calculate the distance optically or using a spatial location. For example, taking the spatial location as an example, an acceleration sensor may be disposed in the target electronic device, and the acceleration sensor may collect acceleration data of the target electronic device. Then, the target electronic device may calculate a moving distance of the target electronic device according to the acceleration data and a moving duration of the target electronic device, and then the moving distance is added into an initial magnetic levitation distance, so that a target distance of the target electronic device may be obtained.

Figure 3:
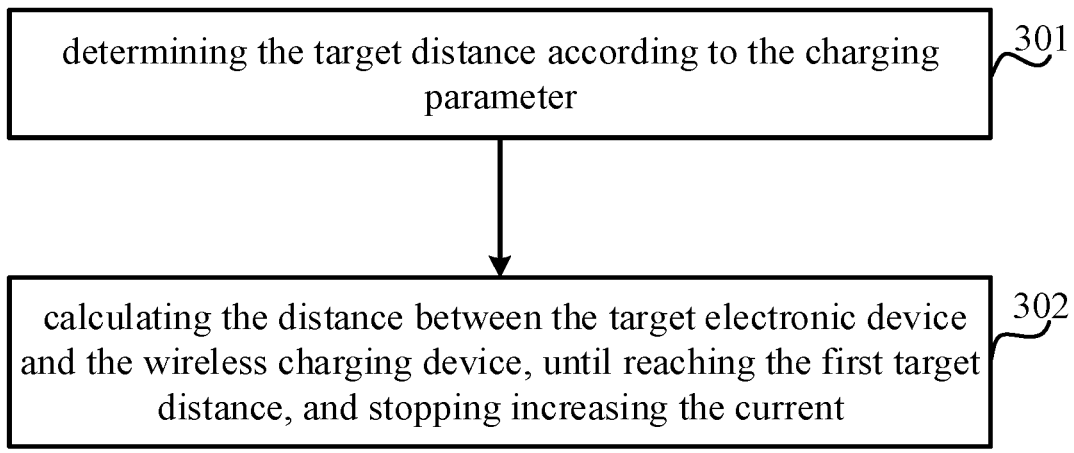
FIG. 3 is a flow diagram illustrating a wireless charging method according to yet some other embodiments.

Based on the above principle, referring to FIG. 3, the wireless charging device may determine the target distance according to the charging parameter (corresponding to block 301 in FIG. 3). Then, the wireless charging device may increase the current of the transmitting coil in the wireless charging device, so that the magnetic field force generated by the transmitting coil is greater than the gravity of the target electronic device, that is, the target electronic device moves upward. In a moving process, the target electronic device may calculate the distance (the initial magnetic levitation distance+a distance moved this time) between the target electronic device and the wireless charging device in real time, until the first target distance is reached, and the wireless charging device stops increasing the current (corresponding to block 302 in FIG. 3).

It should be noted that, in this example, the target electronic device may send the charging parameter and the acceleration data to the wireless charging device, and the wireless charging device may calculate the first target distance according to the charging parameter and calculate a real-time magnetic levitation distance according to the acceleration data, and increase the current in the transmitting coil to enable the magnetic levitation distance of the target electronic device to reach the first target distance, which may also achieve a corresponding effect, and the corresponding solution falls within the protection range of the present disclosure.

In a second situation, the magnetic levitation distance is reduced.

In an example, the wireless charging device may determine what the charging parameter indicates, for example, the charging parameter indicates that the current temperature of the target electronic device is within a second set range, for example, the second set range may be set to be greater than 50 degrees, so that the wireless charging device may decrease the current of the transmitting coil in the wireless charging device to a second target current corresponding to the second set range, so as to decrease the magnetic levitation distance between the wireless charging device and the target electronic device from the current magnetic levitation distance to a second target distance corresponding to the second target current.

In this example, the second target current may be calculated by the target electronic device. The magnetic levitation distance of the target electronic device before the adjustment is known, and the second target distance (i.e. the magnetic levitation distance after the adjustment) corresponding to the charging parameter is also known. Therefore, based on the relationship between the magnetic levitation distance and the gravity (e.g. G=mgh, G represents the gravity, m represents the mass of the target electronic device, and h represents the magnetic levitation distance), the target electronic device may calculate the gravity of the target electronic device according to the second target distance. Since the target electronic device is disposed within the electronic device, the mass (or gravity) of the target electronic device is the mass (or gravity) of the electronic device. In the levitation process, the gravity of the target electronic device and the magnetic field force generated by the wireless charging device are equal in magnitude and opposite in direction. Based on the relation between the magnetic field force and the gravity, the target electronic device may calculate the second target current according to the relation between the magnetic field force and the current. Finally, the wireless charging device may communicate with the target electronic device to acquire the second target current.

The wireless charging device adjusts the current in the transmitting coil to the second target current, so that the magnetic levitation distance between the wireless charging device and the target electronic device is reduced to the second target distance. The current may be adjusted slowly by the wireless charging device in the set step length (adjustable) manner, so that the magnetic levitation distance of the target electronic device is slowly decreased, and the effect of reducing the magnetic levitation distance between the wireless charging device and the target electronic device is achieved. In practical applications, the second target distance may be 0, that is, the target electronic device is in contact with the wireless charging device, so that heat of the target electronic device may be conducted to the wireless charging device, and the increase of a heat dissipation area is beneficial to an improvement of the heat dissipation rate of the target electronic device.

It should be noted that, the wireless charging device may also calculate the second target current. In consideration of the fact that the target electronic device can calculate the second target current by using the processor of the electronic device, the calculation at the wireless charging device is not needed. Therefore, the design difficulty of the wireless charging device is favorably reduced. Those skilled in the art may set according to the specific scenario, and the corresponding solution falls into the protection scope of the present disclosure under the condition that the target current may be calculated.

In another example, the target electronic device may be provided with the distance detection module that may calculate the distance optically or using the spatial location. For example, taking the spatial location as an example, the acceleration sensor may be disposed in the target electronic device, and the acceleration sensor may collect the acceleration data of the target electronic device. Then, the target electronic device may calculate the moving distance of the target electronic device according to the acceleration data and the moving duration of the target electronic device.

Based on the above principle, after the second target distance is determined according to the charging parameters, the wireless charging device may reduce the current of the transmitting coil in the wireless charging device, so that the magnetic field force of the transmitting coil is increased to be greater than the gravity of the target electronic device, that is, the target electronic device moves downwards. In the moving process, the target electronic device may calculate the distance between the target electronic device and the wireless charging device in real time (the distance of the current movement is subtracted from the initial magnetic levitation distance), and the wireless charging device stops reducing the current until the second target distance is reached.

It should be noted that, in this example, the target electronic device may send the charging parameter and the acceleration data to the wireless charging device, and the wireless charging device may calculate the second target distance according to the charging parameter and calculate the real-time magnetic levitation distance according to the acceleration data, and reduce the current in the transmitting coil to enable the magnetic levitation distance of the target electronic device to reach the second target distance, which may also achieve the corresponding effect, and the corresponding solution falls within the protection range of the present disclosure.

In some applications, a heat dissipation device, such as a fan, may be disposed in the wireless charging device. When the target electronic device is suspended above the wireless charging device, a working power of the heat dissipation device may be a first power. When the magnetic levitation distance of the target electronic device is reduced and even the target electronic device contacts the wireless charging device, the working power of the heat dissipation device is increased to be a second power, and the second power is larger than the first power, so that the heat dissipation rate of the wireless charging device is increased, and the heat dissipation rate of the target electronic device is indirectly increased.

Figure 4:
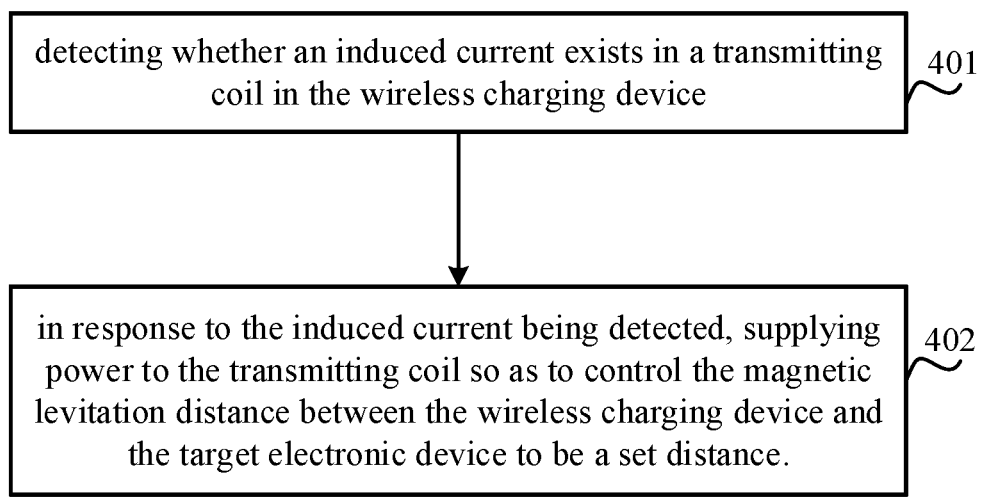
FIG. 4 is a flow diagram illustrating a wireless charging method according to yet some other embodiments.

In some embodiments, after the target electronic device is placed on the wireless charging device, the wireless charging device provides an initial current to the transmitting coil, and the target electronic device is not levitated. Referring to FIG. 4, in the embodiment, the wireless charging device detects whether an induced current exists in the transmitting coil (corresponding to block 401 in FIG. 4). That is, the transmitting coil radiates energy outwards through an electromagnetic field, and after the target electronic device is placed in the wireless charging device, the receiving coil and the transmitting coil are in resonance coupling, so that the energy may be received, and the induced current exists in the receiving coil at the moment. Accordingly, the receiving coil may be regarded as the transmitting coil to radiate energy outwards due to an existence of the induced current, so that the induced current also exists in the transmitting coil, and the wireless charging device may detect the target electronic device by detecting the induced current. At this time, the wireless charging device may supply power to the transmitting coil, and the current is a specified magnitude, so that the electromagnetic field generated by the transmitting coil levitates the target electronic device to a preset height (corresponding to block 402 in FIG. 4), that is, the magnetic levitation distance between the wireless charging device and the target electronic device is increased to a preset initial magnetic levitation distance. In this way, the transmitter coil may not generate the electromagnetic field before the target electronic device is not placed, thereby not consuming energy; after the target electronic device is placed, small energy is utilized to confirm whether the target electronic device is actually placed or not, and a specified current is provided for the transmitting coil after the target electronic device is actually placed, so that an energy utilization rate is favorably improved.

Figure 5:
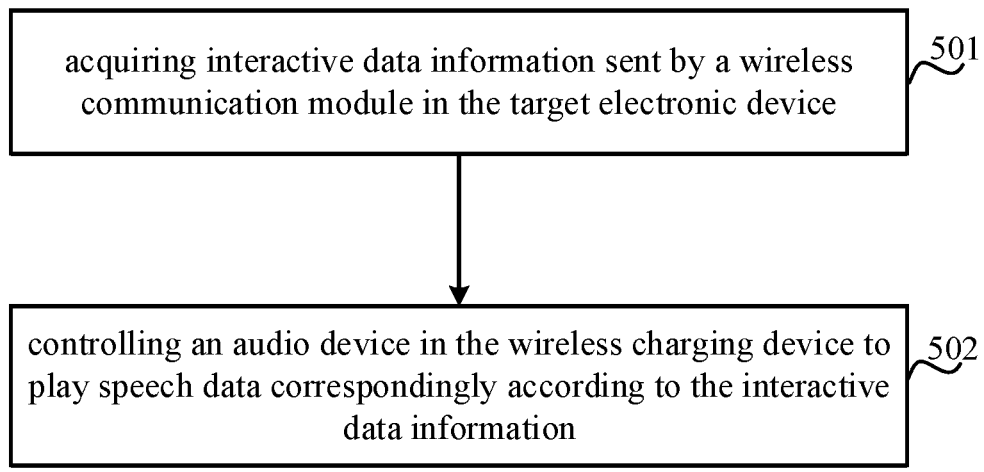
FIG. 5 is a flow diagram illustrating a wireless charging method according to yet some other embodiments.

Considering that the target electronic device and the wireless charging device communicate via wireless communication modules, the wireless communication modules may be Bluetooth modules or Wi-Fi modules. In another embodiment, the wireless charging device may be provided with an audio device, such as a speaker. Taking the Bluetooth module as an example, referring to FIG. 5, the wireless charging device may acquire interactive data information received by its Bluetooth module, and the interactive data information is sent to the Bluetooth module of the wireless charging device by the opposite-end Bluetooth module in the target electronic device (corresponding to block 501 in FIG. 5). The interactive data information includes at least one of the followings: music, live broadcast, prompt information and electronic device dynamic. Then, the wireless charging device controls the audio device to play corresponding speech data according to the interactive data information (corresponding to block 502 in FIG. 5). Thus, an interactivity with the user may be increased in the charging process according to the embodiment.

To this end, according to embodiments of the present disclosure, the charging parameter of the electronic device to be charged is acquired; the charging parameter is related to the current temperature of the target electronic device, detected by the electronic device; and the magnetic levitation distance of the target electronic device above the wireless charging device is adjusted according to the charging parameter so as to adjust the heat dissipation rate of the target electronic device. As can be seen, in the embodiment, after the magnetic levitation distance of the target electronic device is adjusted, a magnetic field coupling strength between the target electronic device and the wireless charging device changes, so as to achieve the purpose of adjusting the charging efficiency of the target electronic device, and further achieve the effect of adjusting the heat dissipation rate of the target electronic device, for example, when the magnetic levitation distance increases, the magnetic field coupling strength weakens, the charging efficiency of the target electronic device becomes lower, and the heat dissipation rate becomes slower due to the increase of the heat productivity of the target electronic device; for example, when the magnetic levitation distance decreases, the magnetic field coupling strength strengthens, the charging efficiency of the target electronic device becomes higher, and the heat dissipation rate increases due to the decrease of the heat productivity of the target electronic device.

Figure 6:
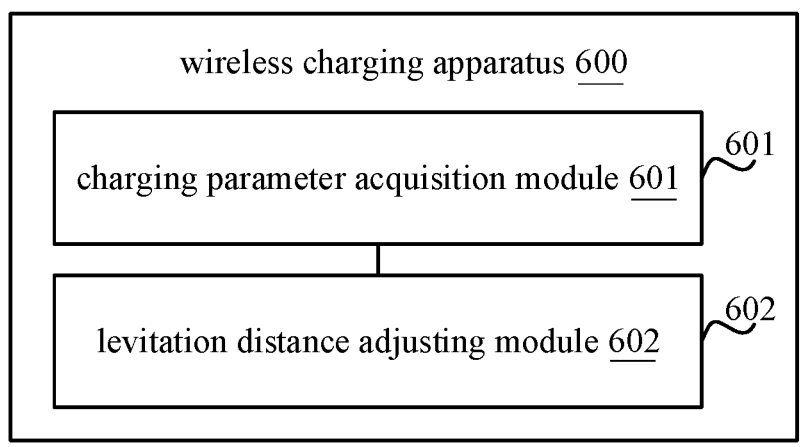
FIG. 6 is a first block diagram illustrating a wireless charging apparatus according to some embodiments.

FIG. 6 is a block diagram illustrating a wireless charging apparatus according to an example embodiment. Referring to FIG. 6, the wireless charging apparatus, which may be applied to a wireless charging device, the apparatus 600 includes a charging parameter acquisition module 601 and a levitation distance adjusting module 602.

The charging parameter acquisition module 601 is configured to acquire the charging parameter of the target electronic device, in which the charging parameter includes the current temperature parameter of the target electronic device.

The levitation distance adjusting module 602 is configured to dynamically adjust the magnetic levitation distance between the wireless charging device and the target electronic device according to the temperature parameter.

Figure 7:
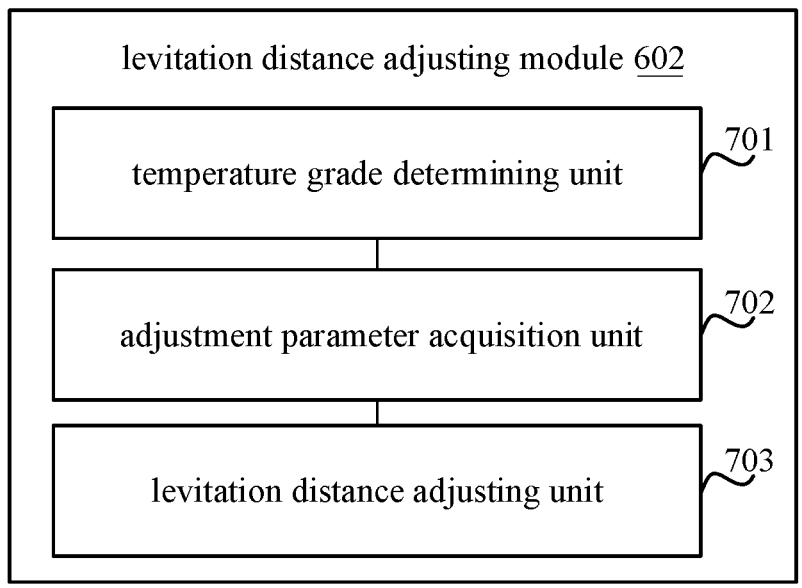
FIG. 7 is a second block diagram illustrating a wireless charging apparatus according to some embodiments.

FIG. 7 is a block diagram illustrating a wireless charging apparatus according to yet some other embodiments. Referring to FIG. 7, on the basis of the wireless charging apparatus shown in FIG. 6, the levitation distance adjusting module 602 includes a temperature grade determining unit 701, an adjustment parameter acquisition unit 702 and a levitation distance adjusting unit 703.

The temperature grade determining unit 701 is configured to determine the corresponding temperature grade according to the temperature parameter.

The adjustment parameter acquisition unit 702 is configured to acquire the charging adjustment parameter corresponding to the temperature grade.

The levitation distance adjusting unit 703 is configured to adjust the magnetic levitation distance between the wireless charging device and the target electronic device according to the charging adjustment parameter.

Figure 8:
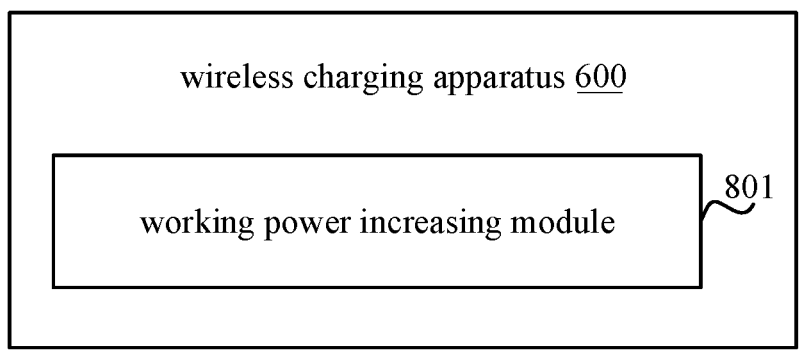
FIG. 8 is a third block diagram illustrating a wireless charging apparatus according to some embodiments.

FIG. 8 is a block diagram illustrating a wireless charging apparatus according to yet some other embodiments. Referring to FIG. 8, on the basis of the wireless charging apparatus shown in FIG. 6, the levitation distance adjusting module 602 includes a working power increasing module 801.

The working power increasing module 801 is configured to, when the magnetic levitation distance between the wireless charging device and the target electronic device is reduced according to the temperature parameter, improve the working power of the heat dissipation device in the wireless charging device so as to improve the heat dissipation rate of the wireless charging device and the target electronic device.

Figure 9:
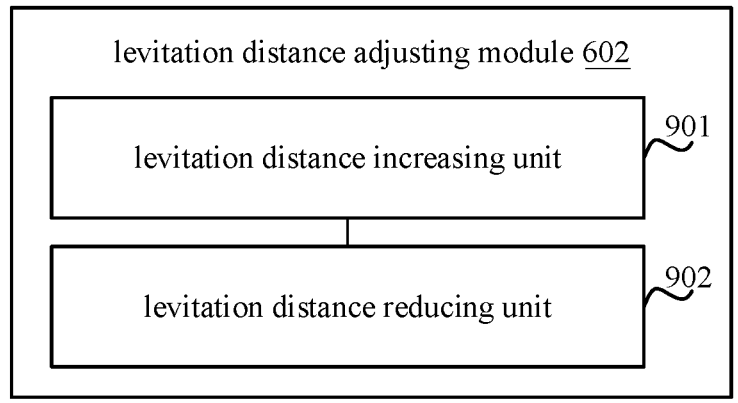
FIG. 9 is a fourth block diagram illustrating a wireless charging apparatus according to some embodiments.

FIG. 9 is a block diagram illustrating a wireless charging apparatus according to yet some other embodiments. Referring to FIG. 9, on the basis of the wireless charging apparatus shown in FIG. 6, the levitation distance adjusting module 602 includes a levitation distance increasing unit 901 and a levitation distance reducing unit 902.

The levitation distance increasing unit 901 is configured to, when a current temperature value of the target electronic device, corresponding to the temperature parameter, is within the first set range, improve a magnetic field intensity of a magnetic field where the target electronic device is located according to a first charging adjustment parameter so as to increase the magnetic levitation distance between the wireless charging device and the target electronic device.

Alternatively, the levitation distance reducing unit 902 is configured to, when the current temperature value of the target electronic device, corresponding to the temperature parameter, is within the second set range, reduce the magnetic field intensity of the magnetic field where the target electronic device is located according to a second charging adjustment parameter so as to reduce the magnetic levitation distance between the wireless charging device and the target electronic device.

Figure 10:
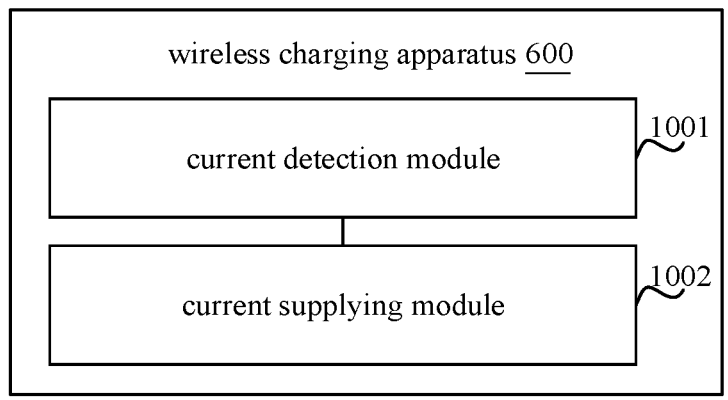
FIG. 10 is a fifth block diagram illustrating a wireless charging apparatus according to some embodiments.

FIG. 10 is a block diagram illustrating a wireless charging apparatus according to yet some other embodiments. Referring to FIG. 10, on the basis of the wireless charging apparatus shown in FIG. 6, the apparatus 600 further includes a current detection module 1001 and a current supplying module 1002.

The current detection module 1001 is configured to detect whether the induced current exists in the transmitting coil in the wireless charging device.

The current supplying module 1002 is configured to, in response to the induced current being detected, supply power to the transmitting coil so as to control the magnetic levitation distance between the wireless charging device and the target electronic device to be a set distance.

Figure 11:
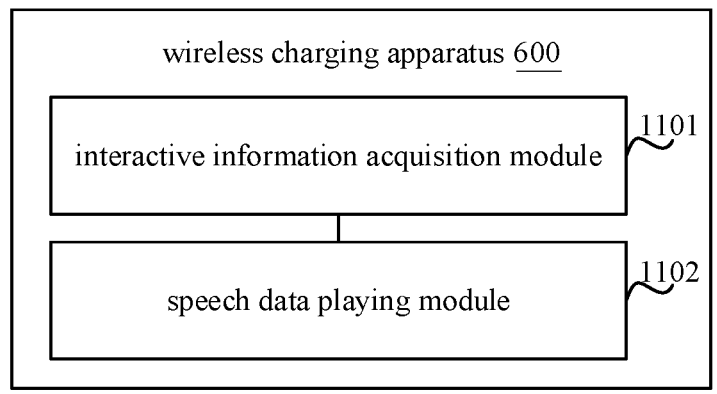
FIG. 11 is a sixth block diagram illustrating a wireless charging apparatus according to some embodiments.

FIG. 11 is a block diagram illustrating a wireless charging apparatus according to some embodiments. Referring to FIG. 11, on the basis of the wireless charging apparatus shown in FIG. 6, the apparatus 600 further includes an interactive information acquisition module 1101 and a speech data playing module 1102.

The interactive information acquisition module 1101 is configured to acquire the interactive data information sent by the wireless communication module in the target electronic device.

The speech data playing module 1102 is configured to control, according to the interactive data information, the audio device in the wireless charging device to play corresponding speech data.

It can be understood that the wireless charging apparatus provided in embodiments of the present disclosure corresponds to the above-mentioned wireless charging method, and specific contents may refer to the contents of embodiments of the method, which are not elaborated here.

As such, according to some embodiments of the present disclosure, the charging parameter, for example, the temperature parameter, of the target electronic device is acquired; and the magnetic levitation distance between the wireless charging device and the target electronic device may be dynamically adjusted according to the temperature parameter. As can be seen, in the embodiments, after the magnetic levitation distance of the target electronic device is adjusted, an electromagnetic field coupling strength between the wireless charging device and the target electronic device changes, so as to achieve the purpose of adjusting the charging efficiency of the target electronic device, and further achieve the effect of adjusting the heat dissipation rate of the target electronic device, for example, when the magnetic levitation distance increases, the electromagnetic field coupling strength weakens, the charging efficiency of the target electronic device becomes lower, and the heat dissipation rate reduces due to the increase of the heat productivity; for example, when the magnetic levitation distance decreases, the electromagnetic field coupling strength strengthens, the charging efficiency of the target electronic device becomes higher, and the heat dissipation rate increases due to a decrease of the heat productivity generated by the target electronic device.

Figure 12:
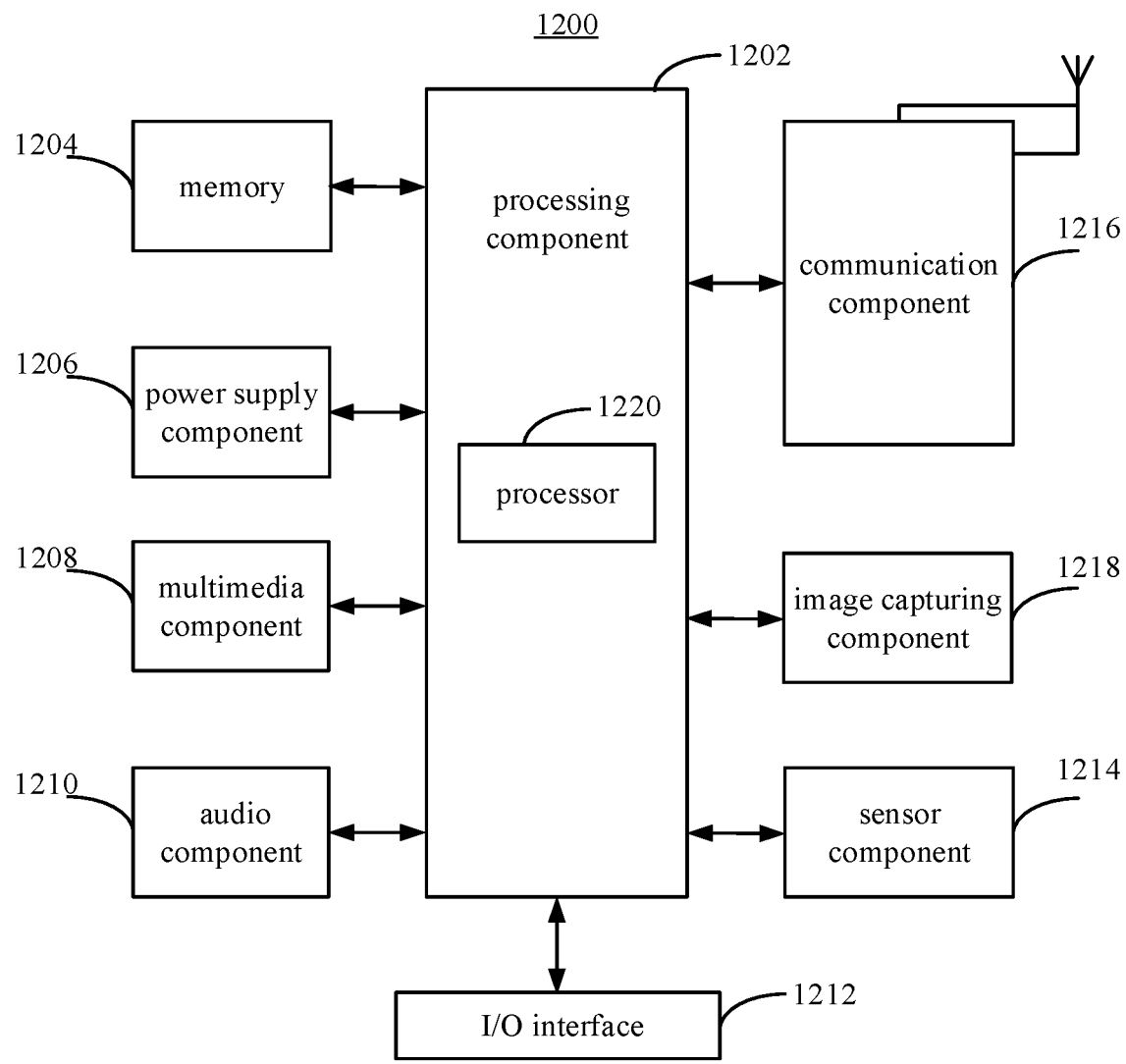
FIG. 12 is a block diagram illustrating an electronic device according to some embodiments.

FIG. 12 is a block diagram illustrating an electronic device according to some embodiments. For example, the electronic device 1200 may be a smart phone, a computer, a digital broadcast terminal, a tablet device, a medical device, an exercise device, a personal digital assistant, etc., that includes the wireless charging apparatus of the wireless charging device and/or the target electronic device.

Referring to FIG. 12, the electronic device 1200 may include one or more of the following components: a processing component 1202, a memory 1204, a power supply component 1206, a multimedia component 1208, an audio component 1210, an input/output (I/O) interface 1212, a sensor component 1214, a communication component 1216, and an image capturing component 1218.

The processing component 1202 typically controls overall operations of the electronic device 1200, such as the operations associated with display, telephone calls, data communications, camera operations, and recording operations. The processing component 1202 may include one or more processors 1220 to execute instructions. Further, the processing component 1202 may include one or more modules that facilitate interactions between the processing component 1202 and other components. For example, the processing component 1202 may include a multimedia module to facilitate the interaction between the multimedia component 1208 and the processing component 1202. In performing the interaction, the processor 1220 may read executable the instructions from the memory 1204, and implement the operations of the method shown in FIGS. 1-5.

The memory 1204 is configured to store various types of data to support the operation of the electronic device 1200. Examples of such data include the instructions for any applications or methods operated on the electronic device 1200, contact data, phonebook data, messages, pictures, videos, and the like. The memory 1204 may be implemented by any type of volatile or non-volatile memory devices, or a combination thereof, such as a Static Random Access Memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic or optical disk.

The power supply component 1206 provides power to various components of the electronic device 1200. The power supply components 1206 may include a power management system, one or more power supplies, and any other components associated with the generation, management, and distribution of power for the electronic device 1200. The power supply component may include the receiving coil for receiving energy from the wireless charging device to wirelessly charge the electronic device, or the electronic device serves as a power supply to wirelessly charge other electronic devices.

The multimedia component 1208 includes a screen providing an output interface between the electronic device 1200 and the target object. In some embodiments, the screen may include a Liquid Crystal Display (LCD) and a Touch Panel (TP). In some embodiments, organic light-emitting diode (OLED) or other types of displays can be employed.

If the screen includes a touch panel, the screen may be implemented as a touch screen to receive input signals from the target object. The touch panel includes one or more touch sensors to sense touches, swipes, and gestures on the touch panel. The touch sensors may not only sense a boundary of a touch or swipe operation, but also detect a duration and a pressure associated with the touch or swipe operation.

The audio component 1210 is configured to output and/or input audio signals. For example, the audio component 1210 includes a Microphone (MIC) configured to receive an external audio signal when the electronic device 1200 is in an operational mode, such as a call mode, a recording mode, and a voice recognition mode. The received audio signal may further be stored in the memory 1204 or transmitted via the communication component 1216. In some embodiments, t, the audio component 1210 further includes a speaker for outputting the audio signals.

The I/O interface 1212 provides an interface between the processing component 1202 and peripheral interface modules, which may be a keyboard, a click wheel, a button, etc.

The sensor component 1214 includes one or more sensors for providing various aspects of state assessment for the electronic device 1200. For example, the sensor component 1214 may detect an open/closed state of the electronic device 1200, a relative positioning of components, such as a display screen and a keypad of the electronic device 1200. The sensor component 1214 may also detect a change of a location of the electronic device 1200 or one component, a presence or absence of the target object in contact with the electronic device 1200, an orientation or acceleration/deceleration of the electronic device 1200, and a change in the temperature of the electronic device 1200.

The communication component 1216 is configured to facilitate a communication between the electronic device 1200 and other devices in a wired or wireless manner. The electronic device 1200 may access a wireless network based on a communication standard, such as Wi-Fi, 2G, 3G, 4G, 5G, or a combination thereof. In some embodiments, the communication component 1216 receives a broadcast signal or broadcast associated information from an external broadcast management system via a broadcast channel. In some embodiments, the communication component 1216 further includes a Near Field Communication (NFC) module to facilitate a short-range communication. For example, the NFC module may be implemented based on Radio Frequency Identification (RFID) technology, infrared data association (IrDA) technology, Ultra-Wideband (UWB) technology, Bluetooth (BT) technology, and other technologies.

In some embodiments, the electronic device 1200 may be implemented by one or more Application Specific Integrated Circuits (ASICs), Digital Signal Processors (DSPs), Digital Signal Processing Devices (DSPDs), Programmable Logic Devices (PLDs), Field Programmable Gate Arrays (FPGAs), controllers, micro-controllers, microprocessors, or other electronic elements.

In some embodiments, a non-transitory readable storage medium including instructions executable by the processor 1220 of the electronic device 1200, such as the memory 1204 including instructions, which is also provided. For example, the non-transitory readable storage medium may be a ROM, a Random-Access Memory (RAM), a CD-ROM, a magnetic tape, a floppy disk, an optical data storage device, and the like.

The various device components, modules, units, blocks, or portions may have modular configurations, or are composed of discrete components, but nonetheless can be referred to as "modules" in general. In other words, the "components," "modules," "blocks," "portions," or "units" referred to herein may or may not be in modular forms.

In the present disclosure, the terms "installed," "connected," "coupled," "fixed" and the like shall be understood broadly, and can be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

In the description of the present disclosure, the terms "one embodiment," "some embodiments," "example," "specific example," or "some examples," and the like can indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described can be combined in a suitable manner in any one or more embodiments or examples. In addition, various embodiments or examples described in the specification, as well as features of various embodiments or examples, can be combined and reorganized.

In some embodiments, the control and/or interface software or app can be provided in a form of a non-transitory computer-readable storage medium having instructions stored thereon is further provided. For example, the non-transitory computer-readable storage medium can be a ROM, a CD-ROM, a magnetic tape, a floppy disk, optical data storage equipment, a flash drive such as a USB drive or an SD card, and the like.

Implementations of the subject matter and the operations described in this disclosure can be implemented in digital electronic circuitry, or in computer software, firmware, or hardware, including the structures disclosed herein and their structural equivalents, or in combinations of one or more of them. Implementations of the subject matter described in this disclosure can be implemented as one or more computer programs, i.e., one or more portions of computer program instructions, encoded on one or more computer storage medium for execution by, or to control the operation of, data processing apparatus.

Alternatively, or in addition, the program instructions can be encoded on an artificially-generated propagated signal, e.g., a machine-generated electrical, optical, or electromagnetic signal, which is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them.

Moreover, while a computer storage medium is not a propagated signal, a computer storage medium can be a source or destination of computer program instructions encoded in an artificially-generated propagated signal. The computer storage medium can also be, or be included in, one or more separate components or media (e.g., multiple CDs, disks, drives, or other storage devices). Accordingly, the computer storage medium can be tangible.

The operations described in this disclosure can be implemented as operations performed by a data processing apparatus on data stored on one or more computer-readable storage devices or received from other sources.

The devices in this disclosure can include special purpose logic circuitry, e.g., an FPGA (field-programmable gate array), or an ASIC (application-specific integrated circuit). The device can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The devices and execution environment can realize various different computing model infrastructures, such as web services, distributed computing, and grid computing infrastructures.

A computer program (also known as a program, software, software application, app, script, or code) can be written in any form of programming language, including compiled or interpreted languages, declarative or procedural languages, and it can be deployed in any form, including as a stand-alone program or as a portion, component, subroutine, object, or other portion suitable for use in a computing environment. A computer program can, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more portions, sub-programs, or portions of code). A computer program can be deployed to be executed on one computer or on multiple computers that are located at one site or distributed across multiple sites and interconnected by a communication network.

The processes and logic flows described in this disclosure can be performed by one or more programmable processors executing one or more computer programs to perform actions by operating on input data and generating output. The processes and logic flows can also be performed by, and apparatus can also be implemented as, special purpose logic circuitry, e.g., an FPGA, or an ASIC.

Processors or processing circuits suitable for the execution of a computer program include, by way of example, both general and special purpose microprocessors, and any one or more processors of any kind of digital computer. Generally, a processor will receive instructions and data from a read-only memory, or a random-access memory, or both. Elements of a computer can include a processor configured to perform actions in accordance with instructions and one or more memory devices for storing instructions and data.

Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few.

Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, implementations of the subject matter described in this specification can be implemented with a computer and/or a display device, e.g., a VR/AR device, a head-mount display (HMD) device, a head-up display (HUD) device, smart eyewear (e.g., glasses), a CRT (cathode-ray tube), LCD (liquid-crystal display), OLED (organic light emitting diode), or any other monitor for displaying information to the user and a keyboard, a pointing device, e.g., a mouse, trackball, etc., or a touch screen, touch pad, etc., by which the user can provide input to the computer.

Implementations of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components.

The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features can be described above as acting in certain combinations and even initially claimed as such, one or more features from a claimed combination can in some cases be excised from the combination, and the claimed combination can be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the implementations described above should not be understood as requiring such separation in all implementations, and it should be understood that the described program components and systems can generally be integrated together in a single software product or packaged into multiple software products.

As such, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing can be utilized.

It is intended that the specification and embodiments be considered as examples only. Other embodiments of the disclosure will be apparent to those skilled in the art in view of the specification and drawings of the present disclosure.

That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

It should be understood that "a plurality" or "multiple" as referred to herein means two or more. "And/or," describing the association relationship of the associated objects, indicates that there may be three relationships, for example, A and/or B may indicate that there are three cases where A exists separately, A and B exist at the same time, and B exists separately. The character "/" generally indicates that the contextual objects are in an "or" relationship.

In the present disclosure, it is to be understood that the terms "lower," "upper," "under" or "beneath" or "underneath," "above," "front," "back," "left," "right," "top," "bottom," "inner," "outer," "horizontal," "vertical," and other orientation or positional relationships are based on example orientations illustrated in the drawings, and are merely for the convenience of the description of some embodiments, rather than indicating or implying the device or component being constructed and operated in a particular orientation. Therefore, these terms are not to be construed as limiting the scope of the present disclosure.

Moreover, the terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

In the present disclosure, a first element being "on" a second element may indicate direct contact between the first and second elements, without contact, or indirect geometrical relationship through one or more intermediate media or layers, unless otherwise explicitly stated and defined. Similarly, a first element being "under," "underneath" or "beneath" a second element may indicate direct contact between the first and second elements, without contact, or indirect geometrical relationship through one or more intermediate media or layers, unless otherwise explicitly stated and defined.

Some other embodiments of the present disclosure can be available to those skilled in the art upon consideration of the specification and practice of the various embodiments disclosed herein. The present application is intended to cover any variations, uses, or adaptations of the present disclosure following general principles of the present disclosure and include the common general knowledge or conventional technical means in the art without departing from the present disclosure. The specification and examples can be shown as illustrative only, and the true scope and spirit of the disclosure are indicated by the following claims.

The invention claimed is:

1. A wireless charging method, applied to a wireless charging device, comprising:

acquiring a charging parameter of a target electronic device, in which the charging parameter comprises a current temperature parameter of the target electronic device;

dynamically adjusting a magnetic levitation distance between the wireless charging device and the target electronic device according to the temperature parameter; and in response to the magnetic levitation distance between the wireless charging device and the target electronic device being reduced according to the temperature parameter, increasing a working power of a heat dissipation device in the wireless charging device to improve a heat dissipation rate of the wireless charging device and the target electronic device.

2. The wireless charging method of claim 1, wherein the dynamically adjusting the magnetic levitation distance between the wireless charging device and the target electronic device according to the temperature parameter comprises:

determining a temperature grade according to the temperature parameter;

acquiring a charging adjustment parameter corresponding to the temperature grade; and adjusting the magnetic levitation distance between the wireless charging device and the target electronic device according to the charging adjustment parameter.

3. The wireless charging method of claim 1, wherein the dynamically adjusting the magnetic levitation distance between the wireless charging device and the target electronic device according to the temperature parameter comprises:

when a current temperature value of the target electronic device, corresponding to the temperature parameter, is within a first set range, improving a magnetic field intensity of a magnetic field where the target electronic device is located according to a first charging adjustment parameter so as to increase the magnetic levitation distance between the wireless charging device and the target electronic device; alternatively, when the current temperature value of the target electronic device, corresponding to the temperature parameter, is within a second set range, reducing the magnetic field intensity of the magnetic field where the target electronic device is located according to a second charging adjustment parameter so as to reduce the magnetic levitation distance between the wireless charging device and the target electronic device.

4. The wireless charging method of claim 1, wherein prior to the acquiring the charging parameter of the target electronic device, the method further comprises:

detecting whether an induced current exists in a transmitting coil in the wireless charging device; and in response to the induced current being detected, supplying power to the transmitting coil so as to control the magnetic levitation distance between the wireless charging device and the target electronic device to be a set distance.

5. The wireless charging method of claim 1, further comprising:

acquiring interactive data information sent by a wireless communication module in the target electronic device; and controlling an audio device in the wireless charging device to play speech data correspondingly according to the interactive data information.

6. The wireless charging method of claim 5, wherein the interactive data information comprises at least one of: music, live broadcast, prompt information, and electronic device dynamic.

7. An electronic device, comprising:

a processor;

a memory device configured to store instructions executable by the processor;

wherein, the processor is configured to execute the executable instructions in the memory to implement a method comprising:

acquiring a charging parameter of a target electronic device, in which the charging parameter comprises a current temperature parameter of the target electronic device;

dynamically adjusting a magnetic levitation distance between the wireless charging device and the target electronic device according to the temperature parameter; and in response to the magnetic levitation distance between the wireless charging device and the target electronic device being reduced according to the temperature parameter, increasing a working power of a heat dissipation device in the wireless charging device to improve a heat dissipation rate of the wireless charging device and the target electronic device.

8. The electronic device of claim 7, wherein the dynamically adjusting the magnetic levitation distance between the wireless charging device and the target electronic device according to the temperature parameter comprises:

determining a temperature grade according to the temperature parameter;

acquiring a charging adjustment parameter corresponding to the temperature grade; and adjusting the magnetic levitation distance between the wireless charging device and the target electronic device according to the charging adjustment parameter.

9. The electronic device of claim 7, wherein dynamically adjusting the magnetic levitation distance between the wireless charging device and the target electronic device according to the temperature parameter comprises:

when a current temperature value of the target electronic device, corresponding to the temperature parameter, is within a first set range, improving a magnetic field intensity of a magnetic field where the target electronic device is located according to a first charging adjustment parameter so as to increase the magnetic levitation distance between the wireless charging device and the target electronic device; alternatively, when the current temperature value of the target electronic device, corresponding to the temperature parameter, is within a second set range, reducing the magnetic field intensity of the magnetic field where the target electronic device is located according to a second charging adjustment parameter so as to reduce the magnetic levitation distance between the wireless charging device and the target electronic device.

10. The electronic device of claim 7, wherein the processor is further configured to execute:

detecting whether an induced current exists in a transmitting coil in the wireless charging device; and in response to the induced current being detected, supplying power to the transmitting coil so as to control the magnetic levitation distance between the wireless charging device and the target electronic device to be a set distance.

11. The electronic device of claim 7, wherein the processor is further configured to execute the following:
acquiring interactive data information sent by a wireless communication module in the target electronic device; and
controlling an audio device in the wireless charging device to play speech data correspondingly according to the interactive data information.

12. A non-transitory computer-readable storage medium having stored therein instructions that, when executed by a processor of a wireless charging device, cause the wireless charging device to implement a method comprising:
acquiring a charging parameter of a target electronic device, in which the charging parameter comprises a current temperature parameter of the target electronic device;
dynamically adjusting a magnetic levitation distance between the wireless charging device and the target electronic device according to the temperature parameter; and
in response to the magnetic levitation distance between the wireless charging device and the target electronic device being reduced according to the temperature parameter, increasing a working power of a heat dissipation device in the wireless charging device to improve a heat dissipation rate of the wireless charging device and the target electronic device.

13. The non-transitory computer-readable storage medium of claim 12, wherein the dynamically adjusting the magnetic levitation distance between the wireless charging device and the target electronic device according to the temperature parameter comprises:
determining a temperature grade according to the temperature parameter;
acquiring a charging adjustment parameter corresponding to the temperature grade; and
adjusting the magnetic levitation distance between the wireless charging device and the target electronic device according to the charging adjustment parameter.

14. The non-transitory computer-readable storage medium of claim 12, wherein dynamically adjusting the magnetic levitation distance between the wireless charging device and the target electronic device according to the temperature parameter comprises:
when a current temperature value of the target electronic device, corresponding to the temperature parameter, is within a first set range, improving a magnetic field intensity of a magnetic field where the target electronic device is located according to a first charging adjustment parameter so as to increase the magnetic levitation distance between the wireless charging device and the target electronic device; alternatively,
when the current temperature value of the target electronic device, corresponding to the temperature parameter, is within a second set range, reducing the magnetic field intensity of the magnetic field where the target electronic device is located according to a second charging adjustment parameter so as to reduce the magnetic levitation distance between the wireless charging device and the target electronic device.

15. The non-transitory computer-readable storage medium of claim 12, wherein the method further comprises:
detecting whether an induced current exists in a transmitting coil in the wireless charging device; and
in response to the induced current being detected, supplying power to the transmitting coil so as to control the magnetic levitation distance between the wireless charging device and the target electronic device to be a set distance.

16. The non-transitory computer-readable storage medium of claim 12, wherein the method further comprises:
acquiring interactive data information sent by a wireless communication module in the target electronic device;
controlling an audio device in the wireless charging device to play speech data correspondingly according to the interactive data information;
wherein the interactive data information comprises at least one of: music, live broadcast, prompt information, and electronic device dynamic.

17. A wireless charging system implementing the method of claim 1, comprising:
the wireless charging device having a transmitting coil; and
the target electronic device configured to be suspended over the wireless charging device by a current in the transmitting coil in the wireless charging device,
wherein:
the target electronic device is configured to send the charging parameter and acceleration data to the wireless charging device;
the wireless charging system is configured to calculate a first target distance according to the charging parameter and calculate a real-time magnetic levitation distance according to the acceleration data, and increase the current in the transmitting coil to enable the magnetic levitation distance of the target electronic device to reach the first target distance for a first temperature;
the wireless charging device is configured to adjust the current in the transmitting coil to a second target current, for a second temperature higher than the first temperature, to thereby reduce the magnetic levitation distance between the wireless charging device and the target electronic to a second target distance, increase a magnetic field coupling strength and a charging efficiency of the target electronic device while increasing a heat dissipation rate increases due to a decrease of the heat productivity of the target electronic device.

* * * * *